United States Patent [19]

Feinberg

[11] Patent Number: 5,613,492
[45] Date of Patent: Mar. 25, 1997

[54] METHOD AND PRODUCT FOR IMPROVED IMAGES IN MAGNETIC RESONANCE IMAGING USING MULTIPLE BREATHOLDING

[75] Inventor: David A. Feinberg, Shokan, N.Y.

[73] Assignee: New York University, New York, N.Y.

[21] Appl. No.: 414,183

[22] Filed: Mar. 31, 1995

[51] Int. Cl.$^6$ .................................................. A61B 5/055
[52] U.S. Cl. ...................... 128/653.2; 324/307; 324/309
[58] Field of Search ....................... 128/653.2; 324/307, 324/309

[56] References Cited

U.S. PATENT DOCUMENTS

| 4,727,882 | 3/1988 | Schneider et al. | 128/653.2 |
| 4,767,991 | 8/1988 | Rzedzian | 128/653.2 |
| 4,856,528 | 8/1989 | Yang et al. | 128/653.1 |
| 4,994,743 | 2/1991 | Glover et al. | 128/653.2 |
| 5,363,844 | 11/1994 | Riederer et al. | 128/653.2 |

Primary Examiner—Marvin M. Lateef
Assistant Examiner—Brian L. Casler
Attorney, Agent, or Firm—Eliot S. Gerber

[57] ABSTRACT

In MRI (Magnetic Resonance Imaging) the signal-to-noise images of a subject's body organs are improved by combining the signals from a number of position co-registered images or fractional data sets. The co-registration is obtained by reducing movement of the organ by the subject holding his breath. A computer cursor may be positioned at a selected point of the subject's organ displayed on the MRI monitor's screen to produce a fiducial marking on the MRI image or fractional data sets, which provides for accurate co-registration. Alternatively, a computer edge detection algorithm is used to determine the edge, and position, of the organ of interest and to produce radio frequency offsets for accurate co-registration of the subsequent images or fractional data sets. The fractional data sets, each having a fiducial marking, are combined to form a final MRI image.

30 Claims, 3 Drawing Sheets

METHOD AND PRODUCT FOR IMPROVED IMAGES IN MAGNETIC RESONANCE IMAGING USING MULTIPLE BREATHOLDING

FIELD OF THE INVENTION

The present invention relates to the medical field of Magnetic Resonance Imaging (MRI) and more particularly to improving the images of moving body organs, especially the liver, kidneys, heart and lungs.

BACKGROUND OF THE INVENTION

Magnetic Resonance Imaging (MRI) is widely accepted as an aid to the medical diagnosis of patients, for example, to detect bone fractures and tumors. MRI is "non-invasive" in that it does not require a surgical procedure, such as a biopsy, to examine the patient's tissues. In many circumstances it produces superior images compared to X-rays, including CT (Computerized Tomography) scanning, and without any side-effect physiological danger from repeated X-ray dosages.

However, the images produced of soft "moving" organs, i.e., organs which normally are in motion, have proven difficult to interpret due to the large amount of "noise" (non-information). For example, a person may breathe (inhale and exhale) 10–20 times a minute with his diaphragm and lungs almost constantly moving. An MRI image of a "slice" (a two-dimensional image reconstruction of a two-dimensional body cross-section) may take one or two minutes. Using fast NMR scan techniques, for example, using a smaller flip angle on some pulses, may still require many milliseconds, for example, 200 milliseconds, to produce a single slice. The resulting image may be blurred or difficult to read. An analogy would be taking a photograph, using a slow shutter speed, for example, 1/60th seconds, of a rapidly moving object, resulting in a blurred image.

To speed up the taking of the MRI image would help reduce the noise arising from moving body organs, i.e., body artifacts. However, generally, the faster the image is taken, the less information it contains. The use of fast MRI imaging of the diaphragm is discussed in Gierada D. S. et al, "Diaphragmatic motion: fast gradient recalled echo MR imaging in healthy subjects," *Radiology* 194, 879–884, 1995.

SUMMARY OF THE INVENTION

The present invention is of a method and system called SMART (Selective Measurement and Registration Tuning) to improve MRI for normally moving body organs. It is an improvement in the signal-to-noise ratio (S/N ratio) of such images.

The invention relies on three features. First, an MRI image or partial image is averaged or the data related to that image or partial image is otherwise combined with images or partial images of the same cross-section to produce a final 2D or 3D MR image. A "partial image" here means a fraction of the data set required to produce a final image. In averaging the "signal", in this case the image, is attempted to remain the same over a plurality of slices (images) of the same cross-section, and the noise is random. This type of signal averaging increases the S/N ratio. But to successfully combine data, the cross-sections must be the same. If the organ itself moves or if the patient moves, however slightly, then the slices will not be aligned (co-registered) and the averaging or other data combining will not produce a satisfactory image. The second feature is to reduce body organ movements, such as lung and diaphragm movements, by breathholding, which is called Multiple Breathhold Average (MBA). The patient holds his inhaled, or exhaled, breath, for 10–30 seconds. In one embodiment a plurality of MRI slice images of the same cross-section, are obtained in one inhaled and held breath.

In another embodiment, MRI slices are taken (performed) over a series of exhaled or inhaled held breaths and then the slices are averaged. The third feature is to accurately locate the organ so that the organ is aligned (co-registered) in the series of images or partial images which are then combined. Such co-registration may preferably be accomplished by the MRI operator moving a computer cursor, i.e., a cursor point or line on the monitor screen, so that the cursor is positioned at a readily recognized body organ portion, such as the upper line of the subject's diaphragm or the edge of the heart, and then taking each of the MRI slices. The cursor produces a fiducial marking on each scan. Alternatively, the slices may be taken, without such operator cursor positioning, and the slice images automatically aligned by computer software which has been programmed to recognize the relevant edges, i.e., the edge indicating the upper line of the diaphragm or edge of the liver or heart. The scans are aligned (co-registered) in the MRI computer system based on the fiducial markings or the organ's edges.

In one preferred embodiment, the patient is asked to hold his inhaled breath, which generally he can easily do for 20–30 seconds. A quick coronal image scan is performed, which takes 3 seconds, the coronal image being parallel with the patient's back. Then, during the same inhaled breath, a series of parallel axial slices taking 25–35 seconds are performed, the axial slices being perpendicular to the coronal slice. The subject breathes and again holds his breath. The quick coronal scan is repeated and the series of axial scans are also repeated. The images for each cross-section are co-registered as they are in the same reference frame, i.e., the position of the edge of the diaphragm. The image time can be long, for example, 20–40 seconds for a set of parallel scans. The scans of each cross-section are then averaged to produce the set of final improved images.

BRIEF DESCRIPTION OF THE DRAWINGS

The following detailed description of the preferred embodiments of the invention should be taken in conjunction with the accompanying drawings. In the drawings.

DETAILED DESCRIPTION

The present invention may utilize a commercially available MRI machine and its associated computer system. However, software (digital control programs) would have to be installed in that machine to implement the invention. That software is generally described below, but is not yet commercially available.

Figure 1:
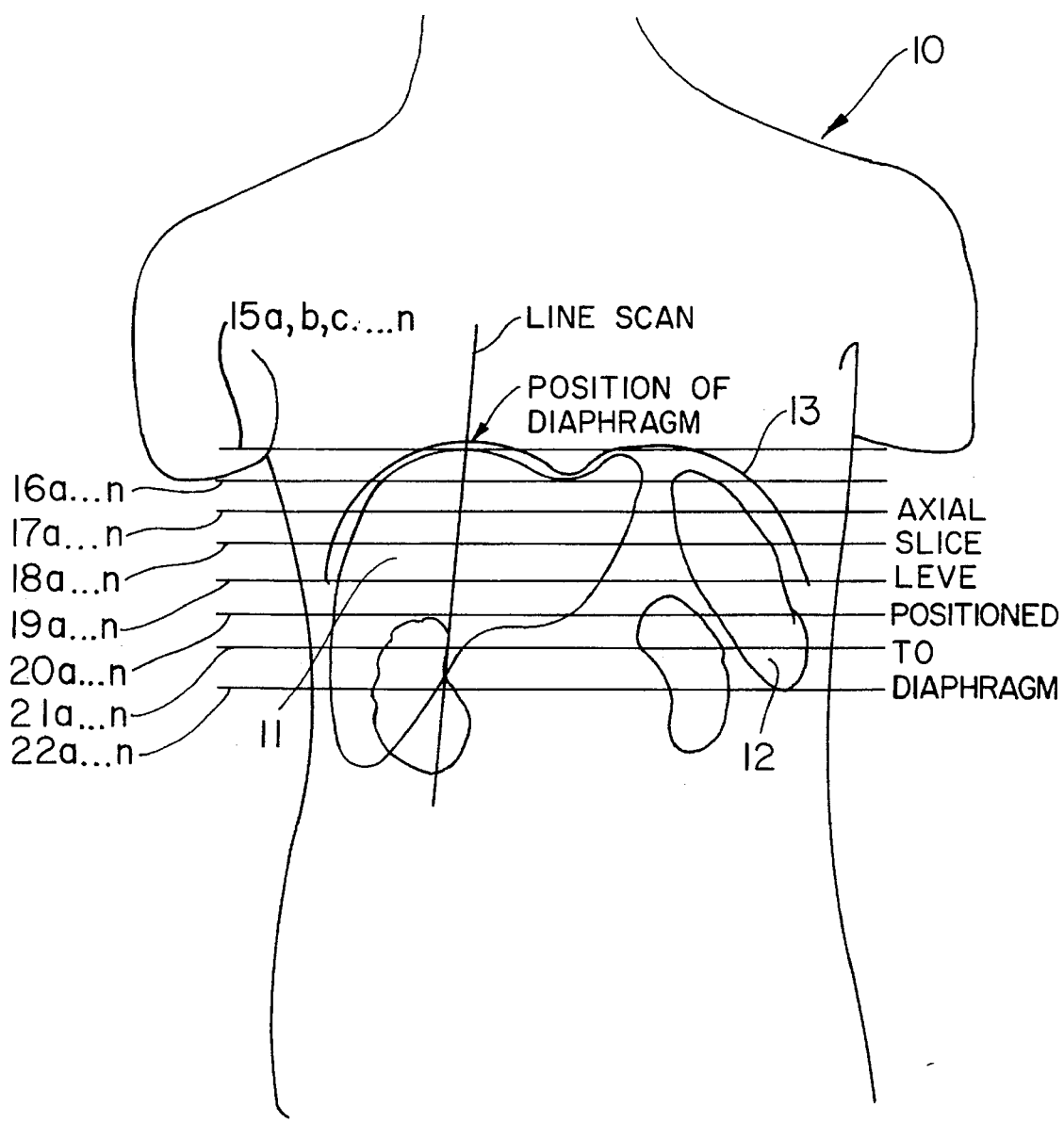
FIG. 1 is a sketch of an MRI coronal scan of a human subject showing the position of the subject's diaphragm and showing the positions of eight axial slices taken along eight different and parallel cross-sections and a single line scan.

As shown in FIG. 1, a coronal MRI slice is performed on a human subject 10 positioned in an MRI machine (not shown). A coronal slice is generally parallel to the subject's back as he lies face upward in the MRI machine. FIG. 1 illustrates the subject's lungs 11,12 and diaphragm 13.

It is conventional MRI practice to perform a series of parallel MRI axial slices, for example, eight, on cross-sections 15-22 during a single scan. The axial slices are perpendicular to the plane of the coronal slice. Such a series of parallel slices presents a series of different cross-sections.

The present invention uses such parallel slices and, in addition, performs slices on the same cross-section over and over again. Such repeated slices of the same cross-section is indicated by the notation 15, a,b,c . . . n, there being n such repeated slices. Generally 3–10 such repeated slices have proven to be sufficient. The eight cross-sections 15-22 and 5 slices for each cross-section results in a total of 40 slices. The 5 slices of each cross-section are averaged providing eight final averaged images, one for each cross-section 15-22.

These repeated slices of each cross-section are then aligned to be co-registered, i.e., the slices 15a . . . 15n are co-registered with each other, the slices 16a . . . 16n are co-registered with each other, etc. Such co-registration is preferably performed without the physical production of the individual slice images as hard copy, but instead co-registration is obtained by aligning the images in the MRI computer system memory. The objective of such co-registration is to average or otherwise combine the information signal, which should be constant and repeated, and lessen the adverse effect of noise, which is random.

Each MRI example will contain two types of activity, (1) the response to the MRI excitation which is the signal S(t) in which t is the analysis epoch, and (2) the reflection of patient artifact and system instabilities which is the noise N(t) which displays random variations in amplitude. The composite signal producing an image pixel is V(t) where:

$$V(t)=S(t)+N(t)$$

When a series of on samples, i.e., a series of slices, are obtained and averaged, the contribution of the signal to the average will be proportional to the number of samples or nS(t)/n. However, the noise is in random relationship to t and the contribution of the noise to the average will be proportional to the square root of the number of samples or n N(t)/n. Thus after n slices the average can be described as:

$$\Sigma V(t) = \frac{nS(t)}{n} + \frac{\sqrt{n}\ N(t)}{n} = S(t) + \frac{N(t)}{\sqrt{n}}$$

The averaging process consequently improves the signal-to-noise ratio.

To obtain such co-registration of slices showing the organ of interest, for example, the subject's diaphragm, the slices of each cross-section must be co-registered in computer memory. For example, a point on the diaphragm is a pixel (two-dimensional image element) at column 70 row 40. That same point, to be successfully averaged, must be at aligned pixels (column 70 row 40) in all the slices. However, as explained below, the computer system will shift the images to align the pixels based upon the frame of reference of the organ being imaged.

One means of obtaining such co-registration is for an experienced operator to move a computer cursor so that it covers the selected line or point on the organ in each image. The subject's position does not permit much rotational movement so that a point cursor may be used, although a line cursor is preferred. The cursor provides a frame of reference for each image, so that the subject's slight movements or the organ's movement from slice to slice has no adverse effect.

Another application of the co-registration method of the present invention is to acquire a fraction of the number of signals used to make each image, i.e., a "partial image", during each breathold. Combining the signals from plural co-registered breathold signals acquisitions, each of which contains a fiducial marking for co-registration, will then give a sufficient number of signals to make a complete image. For example, 512 differently phase encoded signals at each cross-sectional level are required to make a high spatial resolution image, where, in this example, only 64 signals are obtained in a breathold. Using four co-registered signal acquisitions will provide the necessary 512 signals to make a high resolution image. A further combination of the above method is to use eight co-registered breathold data sets. Such eight sets provides two 512 signal images, useful for image averaging for increased SNR.

One limitation of the above-described fractional data set acquisition is that only the abdominal organs which are co-registered will provide linearly phase encoded data useful for Fourier transform image reconstruction and the inconsistent signal from non co-registered body regions will cause some image artifacts. There are several methods, however, of imaging over limited volumes of the body, to exclude these regions of inconsistency form the data set and from the image. One useful application would be for heart imaging, for example, using four breathold data sets to make a complete data set. The overlying breast, present in axial images, would not be co-registered to the heart in each data acquisition, but the breast signal can be excluded from the data set using either surface coils or using orthogonal slice selective gradient pulses (the inner volume imaging method).

EXAMPLE I

The subject is placed face upwards in an MRI machine for examination of his right diaphragm. It has been found that the left and right diaphragms do not move in exact synchronism, so that the selected imaginary line to determine the frame of reference is taken on the right diaphragm. The subject is asked to hold his inhaled breath. A quick scout scan image is taken in the coronal plane, generally parallel with the back of the subject, to the position of the diaphragm, that image taking about 3 seconds. The operator moves his control line cursor, using a mouse controller on the MRI monitor screen, so that the cursor line is on the upper face of the right diaphragm, see FIG. 1. Then axial slices 15a, 16a, 17a–22a are performed in the same breathhold. The subject then is told to exhale and breathe normally. Then the subject is asked to again hold his inhaled breath and the quick coronal image and line cursor positioning is repeated. A second set of axial scans are performed, namely, scans 15b, 16b 17b–22b. This procedure is repeated five times. The images of each cross-section are co-registered in the MRI computer system, using the cursor line positions as the frame of reference. Such co-registration will align (co-register) the scans 15a, 15b, 15c–15e with each other, and align the scans 16a, 16b, 16c–16e with each other, etc. After such co-registration the computer system will average each set of co-registered scans, i.e., average scans 15a–15e, etc. Such averaged scans have a superior S/N ratio and provide a clearer image than the original scans. The individual slices may be thin, for example, 3 millimeters thick.

EXAMPLE II

The objective is to provide a clear image of the subject's heart using rapid MRI imaging techniques, breathholding and cardiac gating. The subject is positioned in an MRI machine face upwards. A conventional EKG (electrocardiograph) is connected to the subject to detect his heart waves. The R wave is taken, with a 200 millisecond delay, as the cardiac gating signal to initiate each successive MRI scan. Each scan is a rapid scan of 200 milliseconds. The operator for each scan moves a point or line cursor on the MRI monitor screen to the outer wall (lateral wall) of the heart to maintain the same frame of reference for each scan.

A series of scans are performed while the subject holds his inhaled breath, preferably 3-8 of such scans being performed for each heart cross-section. The multiple scans of each cross-section are co-registered in the MRI computer system and averaged. The breathholding prevents movement of the heart due to breathing and so permits co-registration and averaging of the scans. There will be some movement of the heart during each 200 millisecond scan due to its muscle activity; but such movement still permits co-registration and averaging. The cardiac gating may be obtained on other features of the heart beat wave (cardiac cycle), either during systole (heart chambers being emptied) or diastole (heart chambers being filled).

Modifications may be made in the present invention within the scope of the sub-joined claims. Such modifications include the following additions or changes.

1. The co-registered images, in the MRI computer system, may be analyzed using techniques in addition to averaging, such as subtraction of one image from another image or subtraction of one image from a set of averaged images. In addition, the co-registered images, in the MRI computer system, may be used to provide other combinations of images or MRI data (complex, phase or magnitude).

2. Co-registration on other spatial axis may be obtained, for example, to provide a 3-D type of image. As another example, an MRI scan program may provide two coronal slices and two axial slices, each of which is repeated during breathholding, co-registered and then averaged. Three-dimensional coordinates, and the use of a cursor to define a fiducial marking for co-registration, may be obtained using multiple directed line scans through the organ of interest.

Figure 2:
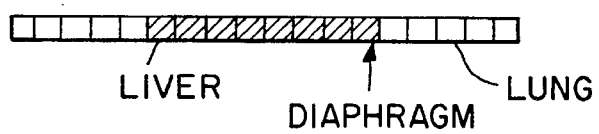
FIG. 2 is an enlarged view of the line scan of FIG. 1.
Figure 3:
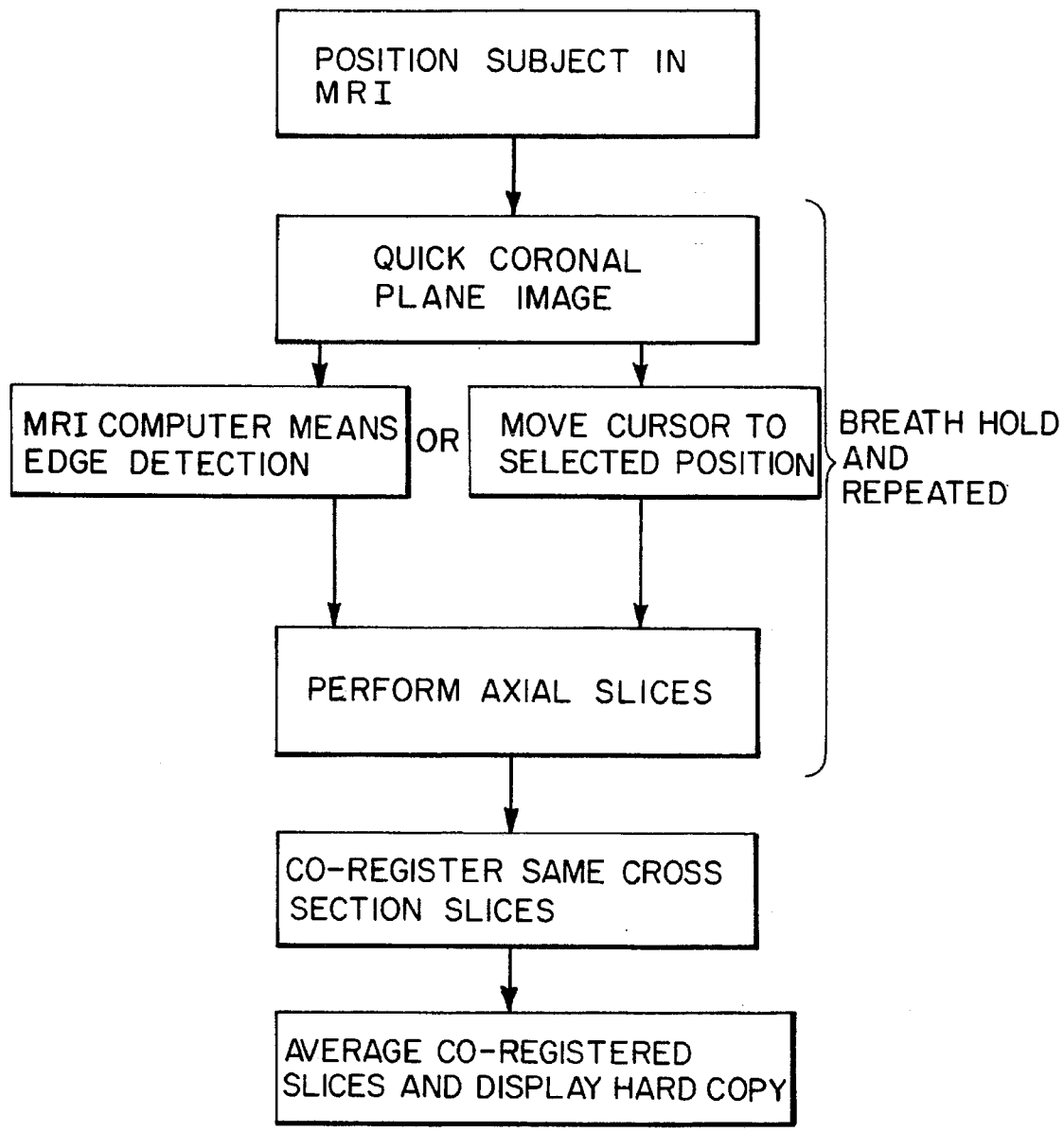
FIG. 3 is a flow diagram of one embodiment of the method of the present invention.
Figure 4:
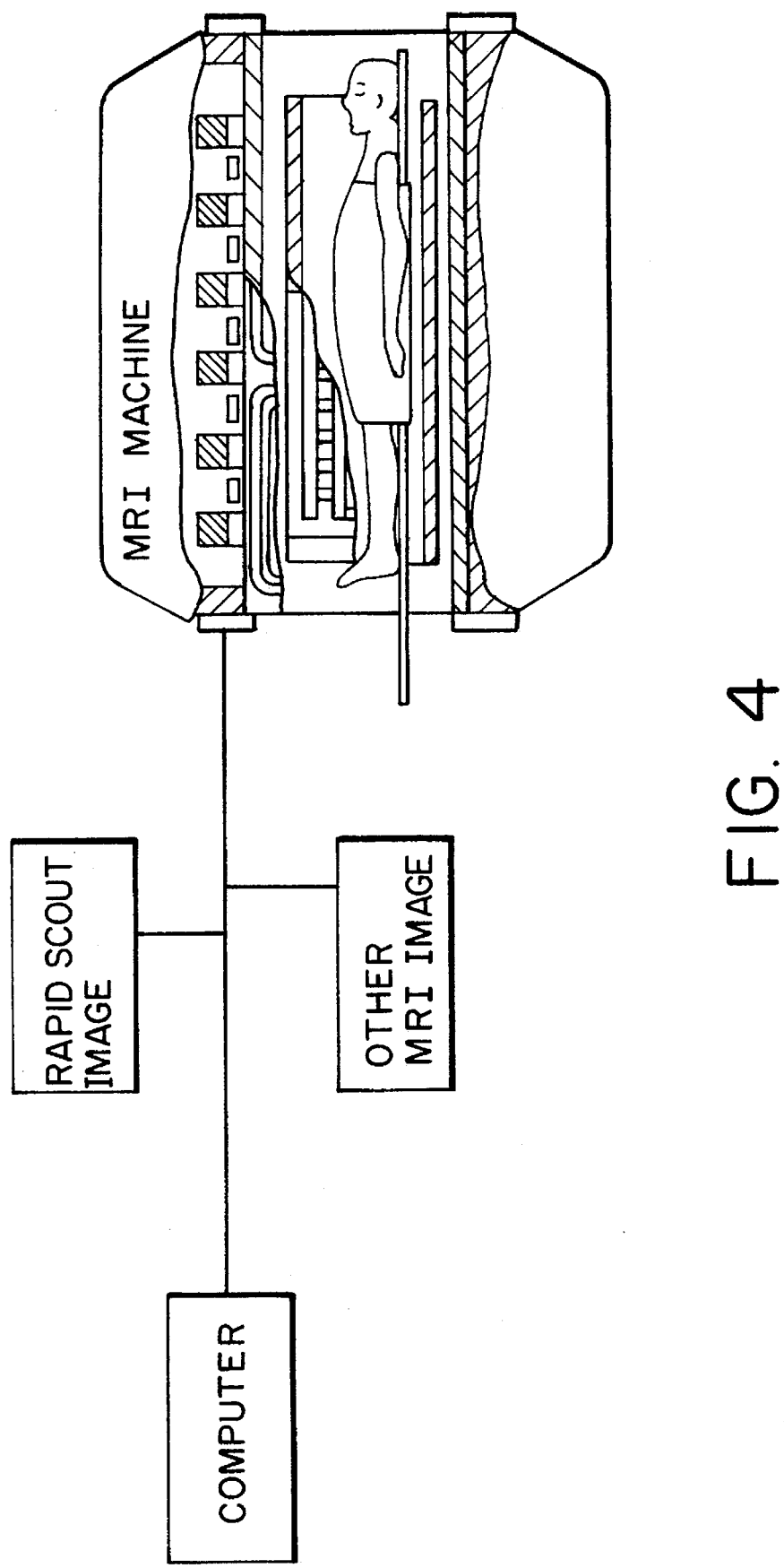
FIG. 4 is a diagram of the system of the present invention.

3. The scout scan image can be reduced in time to a few milliseconds by using a selected one-dimensional line image (column), for example, a column through the diaphragm, as shown in FIG. 2.

What is claimed is:

1. A system in Magnetic Resonance Imaging (MRI) for improving the signal-to-noise ratio of MRI images, including:

(a) an MRI machine supporting a subject to enable the subject to hold his/her breath at least twice;

(b) means for performing a rapid scout image and, based on the scout image, performing at least one other MRI image of the subject simultaneously within each of the sUbject's breatholdings, to thereby align the images from different breatholdings so the images are co-registered; and (c) MRI computer means for data manipulation of the co-registered images to produce an improved hard copy image.

2. The system of claim 1 wherein during each inhaled breath the system includes means for automatically performing a rapid coronal scan followed by an axial image.

3. The system of claim 1 and further including means for positioning a cursor at a selected rapid scout image of a selected body organ portion prior to another image of the same body organ being performed during the same breathholding.

4. The system of claim 1 wherein the data manipulation is averaging.

5. A method in Magnetic Resonance Imaging (MRI) for improving the signal-to-noise ratio of MRI images, including the steps of:

(a) positioning a subject in an MRI machine;

(b) having the subject hold his/her breath at least twice and simultaneously with each breathholding acquiring MRI signals and performing a Fourier transformation to obtain a rapid scout image along one axis to locate an edge of an organ of interest and then performing an MRI image along a different axis whose position is based on the scout image to thereby align the images of the organ of interest performed during different breatholdings so the images are co-registered; and (c) combining the data from the co-registered images to generate a combined image.

6. A method as in claim 5 wherein the subject holds an inhaled breath at least four times.

7. The method of claim 5 and further comprising the steps of performing a set of obliquely oriented images, and thereafter performing another set of differently oriented images.

8. The method of claim 5 wherein the images are averaged in a computer system of the MRI machine.

9. A method as in claim 5 wherein the alignment is obtained by an operator's movement of a cursor to the scout image of a selected body organ portion prior to other images being performed during the same breathholding.

10. A method as in claim 5 wherein the subject holds his/her breath at least three times, performing a predetermined number of images along different cross-sections while holding each of the breaths and the images obtained are averaged by averaging the images from each cross-section with each other.

11. A method as in claim 10 wherein the series of images are axial cross-sections.

12. A method as in claim 11 and further including performing a coronal scan during each holding of the breath prior to performing the series of images.

13. A method as in claim 5 wherein the images are performed in at least one of the following directions: coronal, axial, sagittal, and obliquely.

14. A method as in claim 5 and in addition performing at least one line image.

15. A method as in claim 5 wherein the subject holds an inhaled breath at least four times.

16. The method of claim 5 and further comprising the steps, during each breathholding, of performing a rapid coronal image by Fourier transformation as the scout image and thereafter performing at least one axial image whose position is selected based on the coronal image.

17. A method in Magnetic Resonance Imaging (MRI) for improving the signal-to-noise ratio of MRI images of a subject's body organ, including the steps of:

(a) positioning a subject in an MRI machine having a computer system;

(b) having the subject hold his/her breath a plurality of times;

(c) within each breathold, performing a rapid scout image and moving a cursor on the rapid scout image displayed on an MRI control screen to select a position on the body organ of interest, and then (d) within the same breathold as (c), based on the cursor's position, performing an MRI image which is thereby aligned with other MRI images performed during different breatholds; and (e) combining the MRI images obtained in (d) of the different breatholds to produce a combined image.

18. The method of claim 17 wherein the subject holds his/her breath at least three times, a predetermined number of images are performed along different cross-sections simultaneously during each holding of the breath and the images obtained are averaged by averaging the images from each cross-section with each other.

19. A method as in claim 18 wherein the series of images are axial cross-sections.

20. The method of claim 17 and further comprising, during each breatholding, performing a rapid coronal image as the scout image and thereafter performing at least one axial image as the MRI image.

21. A method in Magnetic Resonance Imaging (MRI) for improving MRI images, including the steps of:

(a) positioning a subject in an MRI machine;

(b) having the subject hold his/her breath during a breathold period at least twice;

(c) during each breathold period performing the following steps i)–iii) in sequence to co-register fractional data sets to the same organ position;

i) acquiring signals and generating a scout scan image;

ii) determining within the scout scan image the position of a region of the organ of interest, which organ may move to different positions in different breathold periods;

iii) positioning and acquiring a fractional data set of data required to produce an MRI image, the fractional data set being positioned based on the scout scan image in order to co-register the fractional data sets; and (d) combining the co-registered fractional data sets from different breathold periods to produce an MRI image.

22. The method of claim 21 and further comprising the steps of performing a rapid coronal image during each inhaled breath and thereafter performing at least one fractional data set.

23. The method of claim 21 further comprising the steps of performing one set of obliquely oriented fractional data sets and thereafter performing another set of differently oriented obliquely oriented fractional data sets.

24. The method of claim 21 wherein the fractional data sets are combined in a computer system of the MRI machine.

25. A method as in claim 21 wherein the alignment is obtained by means for positioning a cursor at a scout image of a selected body organ portion prior to each fractional data set being performed.

26. A method as in claim 21 wherein the subject holds his/her breath at least three times and an additional series of fractional data sets are acquired along different cross-sections simultaneously during each holding of the breath.

27. A method as in claim 26 wherein the series of fractional data sets are axial cross-sections.

28. A method as in claim 27 and further including performing a coronal scan during each holding of the breath prior to performing the series of fractional data sets.

29. A method as in claim 21 wherein the images are performed in at least one of the following directions: coronal, axial, sagittal, and obliquely.

30. A method as in claim 21 and in addition performing at least one line image.

* * * * *